United States Patent [19]

Halbach et al.

[11] Patent Number: 4,933,626
[45] Date of Patent: Jun. 12, 1990

[54] METHODS AND APPARATUS FOR CONTROLLING POWER AMPLIFIERS DRIVING HIGHLY INDUCTIVE LOADS

[75] Inventors: Klaus Halbach, Berkeley, Calif.; Paul Remillard, Acton, Mass.

[73] Assignee: Field Effects, Acton, Mass.

[21] Appl. No.: 401,089

[22] Filed: Aug. 31, 1989

[51] Int. Cl.$^5$ ............................................. G05F 1/44
[52] U.S. Cl. ................................. 323/280; 323/356; 330/85; 324/309
[58] Field of Search ............... 323/280, 281, 274, 356, 323/357, 358; 330/85, 252, 260, 291, 293; 324/309

[56] References Cited

U.S. PATENT DOCUMENTS

| | | | |
|---|---|---|---|
| 3,768,028 | 10/1973 | Wolcott et al. | 330/85 |
| 3,801,919 | 4/1974 | Wilkes et al. | 330/85 |
| 3,808,547 | 4/1974 | Kinkel | 330/85 |
| 3,889,060 | 6/1975 | Goto et al. | 330/85 |
| 3,997,850 | 12/1976 | Gundry | 330/85 |
| 4,213,083 | 7/1980 | Freygang | 323/356 |
| 4,291,276 | 9/1981 | Ida | 330/85 |
| 4,503,289 | 3/1985 | Spires | 323/356 |
| 4,546,318 | 10/1985 | Bowden | 323/280 |

Primary Examiner—Peter S. Wong
Attorney, Agent, or Firm—Helfgott & Karas

[57] ABSTRACT

Techniques for operating a power amplifier in driving a highly inductive load are provided. More particularly, the voltage across a coil load is integrated to obtain a signal representative of the flux and this signal is fed back as an error signal to the power amplifier to conform the instantaneous flux to the input voltage of the power amplifier. Since the power amplifier is operated in a voltage output mode and the flux is forced to conform to the input voltage, the effects of eddy currents are automatically compensated for while the power amplifier displays maximum bandwidth for pulse and sinusoidal input sequences.

14 Claims, 1 Drawing Sheet

METHODS AND APPARATUS FOR CONTROLLING POWER AMPLIFIERS DRIVING HIGHLY INDUCTIVE LOADS

BACKGROUND OF THE INVENTION

This invention relates to power amplifier control techniques and more particularly to methods and apparatus for controlling the output of a power amplifier as a function of the flux induced in a highly inductive load such as a gradient coil of an NMR imaging device. The invention achieves eddy current compensation while permitting an amplifier to properly handle both high bandwidth sinusoidal and pulse waveforms.

The new gradient sequence techniques employed for NMR imaging are presently of great interest to NMR scientists in that the same allow NMR images to be formed in a few minutes to under a minute rather than the tens of minutes usually required. Here, selected sequences of pulses and sinusoids are supplied to the gradient coil of an NMR device to cause rephasing of the proton spin instead of the more conventional approach of rephasing utilizing an R.F. pulse applied to the R.F. coil. These gradient sequence techniques, while being highly advantageous from the standpoint of the time required for image production and a marked reduction in the amount of R.F. to which is used and to which a patient is exposed to, imposed substantial operating hardships on the power amplifiers employed to drive the gradient coil in an NMR device. These hardships are often beyond the capability of the driving circuitry employed.

More particularly, most power amplifiers employed to drive the gradient coil in NMR devices operate as current mode output amplifiers wherein the output current produced is an exact representation of the voltage input supplied to the control circuit thereof. This mode of operation has been generally preferred since the function of the gradient coil in an NMR device is to produce a flux or field and its is know that flux produced is directly proportional to the current if no eddy currents are present.

Eddy currents and particularly those induced outside the wires of the power circuit represent a substantial problem in association with the gradient coils of NMR devices since eddy current effectively act to oppose the type of field which is desired to be produced. Further, if attempts are made to switch the field too fast, a situation can occur where no instantaneous field is present since the nearly equal and opposite effects of the field produced by eddy currents can act to cancel the field that is sought to be produced. This is particularly a problem where fast gradient sequence techniques are employed.

If the eddy currents produce a field that is spatially distributed in the same manner as the field produced by a gradient coil, attempts to make the signal provided to the coil compensating may be implemented by feedback control or through digital or analog signal predistortion techiques. With signal predistortion techniques, the input voltage to the amplifier is deliberately distorted so that the current supplied to the gradient coil will generate components of flux to compensate for the fields generated by the eddy currents induced. Such predistortion techniques are usually developed on an empirical basis and must be varied in accordance with the nature of the signal which is selected for application to the gradient coil.

Where gradient sequence techniques involving pulses and/or sinusoidal sequences are involved, empirical approaches to predistorting the input information supplied to the power amplifier driving the gradient coil can be tedious and time consuming. This is present even when time constants for dealing with the compensation function are provided by way of computer. Full compensation is rarely available because the flow of eddy currents is not generally limited to anticipated locations due to the non-optimum configuration of conducting surfaces where eddy currents are produced. Therefore, some eddy current fields are usually produced which are spatially incorrect and cannot be compensated.

The problem with eddy currents in NMR devices is so substantial that many designers have attempted to create a passive eddy current shield where conducting surfaces are provided in an effort to deliberately induce eddy currents having know spatial characteristics to enable the equal and opposite fields produced thereby to be cancelled by way of compensation. These, techniques typically attempt to create an ideal mirror for eddy currents by providing a conducting cylinder having the characteristics of infinite length so that the currents which are caused to flow are a perfect mirror of the currents in the coil. Infinite length characteristics are achieved by placing the conducting close to the coil. Thus, here all eddy currents which are induced are induced in the positive shield formed by the cylinder and therefore, in theory, may be compensated for by predistortion of currents launched in the gradient coil.

Those of ordinary skill in the art will appreciate that such predistortion techniques increase the current required to be produced by the power amplifier driving the gradient coil. Further, where a passive shield in the form of an infinite cylinder is employed, the characteristics of an infinite cylinder are generally achieved by placing the cylinder structure close to the coil. Thus further increases the magnitude of the eddy currents produced and hence, the magnitude of the current components which must be produced by the power amplifier to achieve predistortion. Thus, the whole approach to predistorting the input waveform to the power amplifier to compensate for the opposing fields produced by eddy currents, is one which inherently relies on increasing the current provided by the power amplifier.

Current mode output amplifiers generally employed to drive the gradient coils in NMR imaging devices have compromised design which is optimized in terms of providing output sequences which are either sinusoidal in nature or pulsed. This is necessary since in a current mode output amplifier a feedback series resistor is typically provided within the amplifier to guarantee that the current is an exact representation of the input control voltage signal. Thus, while the output impedance of a current mode output amplifier is typically very high, the resistance of the series resistor is quite low. This means that the voltage produced by the amplifier is exactly across the load, which in the case of a gradient coil, is almost purely inductive. As a result, the amplifier must frequently produce both maximum current and maximum voltage simultaneously with resistance of load reflected by the gradient coil generally being less than 1 ohm since, the amplifier is driving an essentially inductive load.

For this reason when the full voltage of the amplifier is to be provided in association with the output of sinusoidal signals, a resistance is frequently provided in series with the load to provide a location for part of the voltage across the output of the amplifier to drop so that the heat associated therewith may be dissipated. This is appropriate because with a sinusoidal output more time is generally required at higher power levels so that a resistor is needed to dissipate both voltage and heat. Conversely under sinusoidal output waveform conditions, if no resistor is provided in series with the load, heat must be dissipated within the amplifier causing the same to heat badly. Thus a design selection which employs a series resistor is prefectly acceptable when sinusoidal output information is to be provided in that the same allows full bandwidth while the deleterious effects of heating in the amplifier are avoided.

Use of a resistor in series with a gradient coil load is not acceptable in cases where the output of the power amplifier takes the form of pulses in the shape of square waves or the like. Here, what is then desired is that the pulses be able to rise as fast as possible. This means full signals is to be applied across the load as quickly as possible. Hence, no series resistor is desirable because the full voltage of the amplifier would not be available across the load and fast rise times, which are required in the case of rapid pulse gradient methods, would not be achieved. Accordingly, when a current mode output amplifier is to provide pulse information to a gradient coil, use of a resistor in series with the load is either reduced or avoided since the full voltage of the amplifier across the gradient coil is required. This too is an acceptable design since the nature of the pulse information involved reduces the heat which must be dissipated by the amplifier from that present when sinusoids are employed.

The new gradient sequence techniques employed by NMR scientists, however, often require that both pulse and sinusoidal sequences be utilized so that conventional design compromises adapted to accommodate either pulses or sinusoids in current mode output amplifiers are not advantageous. Thus, unless switching in and out of the resistor in series with the gradient coil is utilized in association with a programming of the sequences to be output by the power amplifier, the compromised design criteria may not be employed. Such switching, however, is of dubious utility since appropriate current/high voltage switches for this purpose are expensive and difficult to implement. Furthermore, imposing amplifier switching requirements on an NMR scientist experimenting or developing new gradient sequencing techniques is onerous since such an experimenter should only be concerned with the attributes of a particular sequence being designed and not the requirements of the power amplifier for portions of a sequence involving pulses and sinusoids.

Therefore, it is a principal object of the present invention to provide improved methods and apparatus for controlling power amplifiers driving highly inductive loads such as the gradient coils in NMR imaging devices.

A further object of this invention is to provide methods and apparatus for controlling power amplifiers driving highly inductive loads to automatically compensate for eddy currents induced in surrounding structure.

An additional object of the present invention is to provide methods and apparatus for controlling amplifiers delivering both high bandwidth sinusoids and pulse waveforms to a highly inductive load.

Various other objects and advantages of the present invention will become clear from the following detailed description of an exemplary embodiment thereof and the novel features will be particularly pointed out in conjunction with the claims appended hereto.

SUMMARY OF THE INVENTION

In accordance with the teachings of the present invention, techniques for operating a power amplifier in driving a highly inductive load are provided herein the voltage across the load is integrated to obtain a signal representative of the flux and this signal is fed back as an error signal to the power amplifier to conform the flux being produced to the input control voltage to the power amplifier. Because the power amplifier is operated in a voltage output mode and flux is forced to conform to the input control voltage, the effects of eddy currents are automatically compensated for while the power amplifier displays maximum bandwidth for pulse and sinusoidal input sequences. This form of operation of the power amplifier is hereafter referred to as a "flux output mode."

BRIEF DESCRIPTION OF THE DRAWINGS

The invention will be more clearly understood by reference to the following detailed description of an exemplary embodiment thereof in conjunction with the accompanying drawings in which:

FIG. 2 illustrates typical waveforms showing the effects of eddy currents on the flux produced by a gradient coil wherein

DETAILED DESCRIPTION

Figure 1:
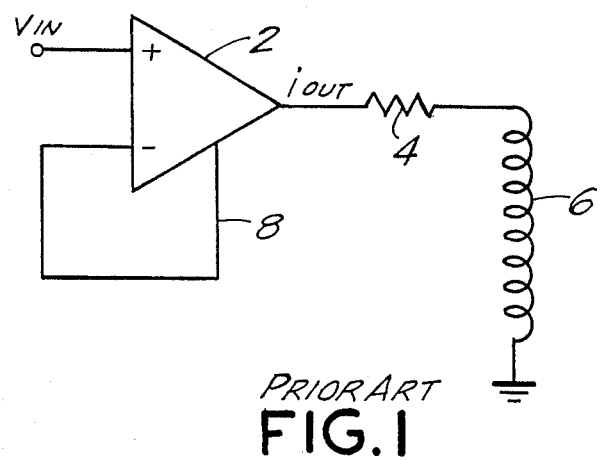
FIG. 1 is a block diagram serving to schematically illustrate a conventional current mode output amplifier typically employed to drive a gradient coil in an NMR apparatus.

Referring now to the drawings and more particularly to FIG. 1 thereof, there is shown a block diagram schematically illustrating a conventional current mode amplifier such as is typically employed to drive a gradient coil in the NMR application. The prior art circuit illustrated in FIG. 1 includes a power amplifier 2, a series resistor 4, and a gradient coil 6. The power amplifier 2 may take the form of one or more amplifiers connected in series having differential inputs. The amplifier configuration, as represented by the power amplifier 2, would have high power characteristics such that the same is capable of putting a ramp pulse at a sufficient voltage into a load having a resistive and an inductive component.

The input to the power amplifier 2 annotated the "$V_{in}$" would receive an input voltage having a waveform corresponding to the current waveform to be produced at the output of the power amplifier marked "$_{out}$." While not shown in FIG. 1, an internal feedback resistor such as a series resistor is provided within the power amplifier 2 to ensure that the current produced by the power amplifier 2 at the terminal annotated "$i_{out}$" is an accurate representation in waveform of the input voltage applied to the terminal annotated $V_{in}$. The feedback loop from the internal series resistor is indicated by the conductor 8, connected to the negative input to the power amplifier 2. The power amplifier 2 thus acts in the conventional manner as a current source exhibiting a very high output impedance.

Connected to the output of the power amplifier 2 is a voltage dropping resistor 4 and the gradient coil 6 which are connected in series. The value of the voltage dropping resistor 4 will be switched as a function of the nature of the current waveform to be produced by the power amplifier 2 in a manner to be described in greater detail below. The gradient coil 6 preferably takes the form of a low impedance gradient coil which represents a load which is dominantly inductive. Thus, a low impedance gradient coil might typically exhibit a resistance value of from ½ to 1 ohm, and an inductance value of from 500 to 650 microhenries, although ranges from 10 milliohms to 50 ohms and from 200 microhenries to 1.5 millihenries are available.

The function of the gradient coil 6 within an NMR device, as well known to those of ordinary skill in the art, is to produce a precise flux directly related to the input information applied to the power amplifier 2 as the same is critical to interpretation of the NMR images produced. With gradient sequencing techniques a signal is generated by rephasing spins without use of R.F. power or with lower R.F. dissipation in the patient. The process is reversed to cause the spins to rephase. The gradient coil 6 functions to gradient refocus images and as a result allows the time interval associated with image production to be markedly reduced. Gradient sequencing techniques have several advantages. One is that R.F. dissipation in a patient is reduced. This can be a health hazard which is to be avoided. This coupled with increased speed of image production makes this techniques highly desireable. In addition the lowering of R.F. enables a shortened Te which yields a better Ti waving image. There is however a practical limit in how close together Te and Ti can be and this tends to be a function of eddy current effects.

Gradient sequencing techniques are also advantageous for short Te experiments in that Te weighted images having short echo times may be formed. Hereto eddy currents effects must be carefully controlled. Thus in each case, the ability of the flux produced by the gradient coil 6 to be generated as a function of the input information supplied to the power amplifier 2, is of critical importance.

The choice of a current mode output amplifier for the power amplifier 2 would, at first blush, appear to be an especially good one since the flux produced by the gradient coil 6 is directly proportional, in the absence of eddy currents, to the current output produced by the power amplifier 2. When a current mode output amplifier is provided with an internal feedback series resistor, the current output is guaranteed to be representative of the voltage signal input. Therefore, the input to the amplifier 2 may be employed to ensure precise and exacting control of the flux generated by the gradient coil 6. However, when the effects of eddy currents cannot be compensated, this theory, as shall be seen in connection with FIG. 2, breaks down. In addition, current mode output amplifier operation cannot be optimized for the various facets (pulse and sinusoidal) of operation employed when gradient sequence techniques are utilized.

The problem typically encountered when current mode output amplifier arrangements are employed to drive a gradient coil in the manner depicted in FIG. 1, is that what the amplifier must deliver is a function of current and load properties. Where the output impedance of the power amplifier 2 is very high while the resistance of the series resistor used therein is quite low, the voltage produced by the power amplifier 2 is exactly across the load requiring the amplifier to frequently and simultaneously produce both maximum current and voltage. If the value of the resistor 4 in series with the load is small or even nonexistent, placing the full value of the voltage of the power amplifier 2 across the load, requires the power amplifier 2 to dissipate substantial amounts of heat since the resistance of the coil load is extremely small.

This often means that the power amplifier 2 will heat badly causing the same to shut down. The effect is particularly severe where the output current of the power amplifier 2 must exhibit a sinusoidal variation. For this reason, where the output of the power amplifier 2 is to be essentially a sinusoid, the series resistor 4 is provided so that a portion of the voltage output of the amplifier maybe dropped prior to the load and heat associated therewith dissipated by the resistor 4. Since not as much power is dropped across the amplifier an increase in the power bandwidth for sinusoidal systems results. This approach therefore provides the full available lower bandwidth from the amplifier 2. However, this particular solution for sinusoids prevents all of the voltage of the amplifier being available to the load in the form of the gradient coil 6 when the same is needed.

For square waves or pulse outputs from the power amplifier 2, fast rise times are necessary. For this reason, all of the voltage from the power feedback amplifier 2 must be available across the gradient coil 6 to ensure steep rise times and maximum switching rates since this allows the amplifier to pulse faster. Thus, in these cases the value of the series resistor 4 is reduced, or removed, to ensure fast rise times. This is acceptable because when the output of the power amplifier 2 is in the form of a pulse sequence or the like, the heating which results within the power amplifier 2 is much less than in the case of a sinusoid.

Due to these operating considerations, it was customary in the design of current mode output amplifier configurations for driving gradient coils to adopt to compromise design which was specially tailored to deliver either pulse or sinusoidal output current waveforms. In the compromise design, the value of the resistor 4 would be selected accordingly. Such compromise designs cannot provide both sinusoidal outputs having the maximum power bandwidth of the amplifier and pulsed outputs exhibiting maximum switching rates and fast rise times. However, the new gradient switching techniques typically require varying sequences of pulses exhibiting fast rise times as well as sinusoids. Accordingly, it will be seen that current mode output amplifier configurations are not intrinsically well suited to gradient sequence techniques and the rapid gradient refocusing of images available therewith.

A further difficulty with current mode output amplifier arrangements is that the flux output thereof is only directly proportional to the current within the gradient coil in the absence of eddy currents. This means that even though the current output of the power amplifier 2 can be made to be a faithful reproduction of the voltage input signal, the resulting flux produced by the gradient coil 6 will not be directly proportional to the output current when eddy currents are present. This occurs since eddy currents, as well known to those with ordinary skill in the art, will themselves generate a field that opposes the field that the current from the power amplifier 2 is attempting to induce. Furthermore, if an attempt is made to switch the field within the gradient coil 6 at too fast a rate, the equal and opposite cancelling field generated by the eddy currents can result in a condition where no instantaneous field is present.

Eddy currents, as discussed in the introductory portion of this application, are a substantial problem in NMR equipment due to the non-ideal current flow associated with the configuration of conducting surfaces which are present. These eddy currents and the resulting fields produced thereby, which are gradient fields, can often lead to substantial imaging inaccuracies. In fact, eddy current problems are so substantial in NMR apparatus that designers thereof often establish positive eddy current shields to cause the resulting eddy currents to occur within a defined surface to ensure that the field generated thereby is at least spatially coherent with the field being generated by the gradient coil. When this is done, predistortion techniques which may be implemented through analog or digital processing of the voltage input to the power amplifier 2, can be employed to compensate for most of the deleterious effects of eddy currents. However, 100% compensation in time and space for eddy currents is rarely, if ever, available.

Figure 2A:
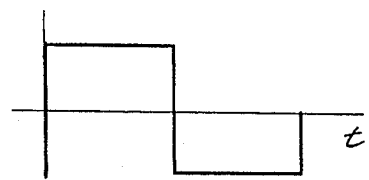
FIG. 2a shows an input waveform and the theoretical flux which should be produced therefrom.

FIG. 2 illustrates typical waveforms showing the effects of eddy currents on the flux produced by a gradient coil and exemplary predistortion techniques used in the correction thereof. For Example, FIG. 2a illustrates a waveform where time is plotted along the abscissa and current is plotted along the ordinate. The current waveform may be considered to be a typical square wave current output from the amplifier 2 to the gradient coil 6 in FIG. 1.

Figure 2B:
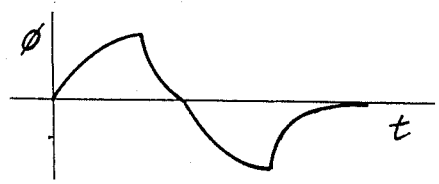
FIG. 2b illustrates actual flux produced in a gradient coil as a result of eddy currents and FIG. 2c illustrates conventional predistortion techniques.

In theory and in the absence of eddy currents, the flux through a coil should be directly proportional to the current, as shown in FIG. 2b, applied to the gradient coil 6. However, as shown in FIG. 2b, due to the presence of eddy currents, the flux within the gradient coil 6 will vary in the manner illustrated in FIG. 2b where time is again plotted along the abscissa and flux is plotted along the ordinate. Thus, it is seen that when a current waveform, such as illustrated in FIG. 2a, is applied to the gradient coil 6, the resulting flux induced therein as shown in FIG. 2b will not in any way closely approach the current waveform illustrated in FIG. 2a.

Figure 2C:
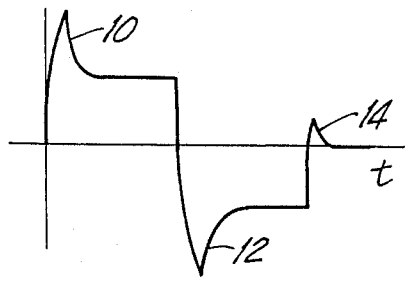

For this reason, as shown in FIG. 2c, the current waveform output by the current amplifier 2 will frequently be predistorted to exhibit high amplitude spikes in areas of transition to compensate for the distortion associated with the eddy currents. Thus, the predistortion indicated by the locations 10, 12, and 14 in FIG. 2c, may be obtained through analog filter circuits or the like, digital filters, or by way of programming techniques, all of which predistort the voltage waveform of the input to the power amplifier 2 to compensate for the effects of eddy currents on the flux produced within the gradient coil 6. The predistortion values are generally established empirically when NMR imaging apparatus is built and calibrated and thereafter recalibration is generally necessary when the NMR apparatus is installed. When experimental gradient sequence techniques are being developed, reprogramming of the empirical predistortion values must frequently be implemented.

While in theory programmed switching of the value of the resistor 4 shown in FIG. 1 and modifying the predistortion values 10, 12, and 14 illustrated in FIG. 2c, could be employed for the continued use of current mode output amplifier arrangements such as illustrated in FIG. 1, the time and apparatus which would be consumed thereby is not conductive to either experimentation or treatment with NMR apparatus. Hence, another arrangement which permits both pulse and sinusoidal sequences to be utilized while exhibiting full amplifier bandwidth and compensation for the effects of eddy currents is required. Such an arrangement is illustrated in FIG. 3.

Figure 3:
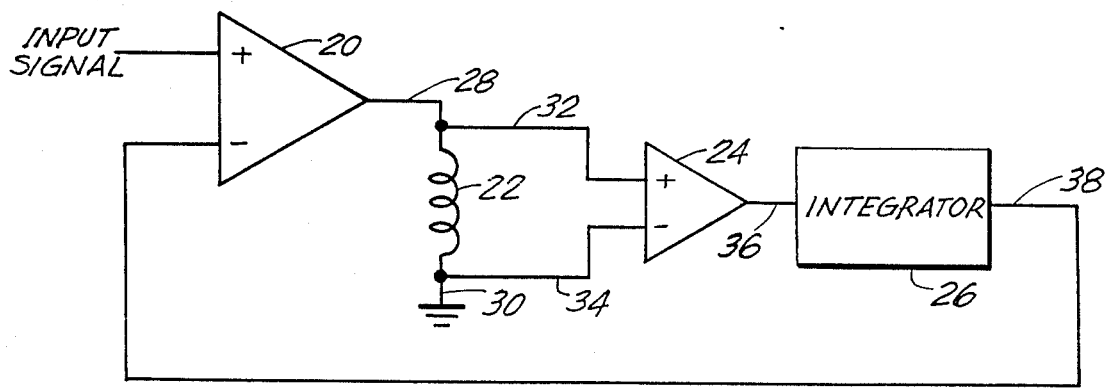
FIG. 3 is a block diagram schematically illustrating a preferred embodiment of the present invention.

Referring now to FIG. 3, there is shown a schematic block diagram of a preferred embodiment of the present invention for driving an NMR gradient coil arrangement. The embodiment of the invention illustrated in FIG. 3 comprises a power amplifier 20, a gradient coil 22, a differential amplifier 24, and an integrator 26. The power amplifier 20 may take exactly the same form of power amplifier described in association with element 2 in FIG. 1 with the single exception that the internal series resistor and the feedback conductor 8 therefor is removed. The power amplifier 20 is provided with differential inputs as aforesaid. An input signal, in the form of a designated voltage waveform having appropriate sinusoidal and pulse sequences as the case may be, is provided at the input to the power amplifier 20 annotated "input signal". The output of the power amplifier 20 is applied through the conductor 28 directly to the gradient coil 22 which, again, may take precisely the same form as the gradient coil 6 described in connection with FIG. 1. The gradient coil 6 is connected through conductor 30 to ground while the voltage across the of the differential amplifier 24 through the conductors 32 and 34, respectively.

Essentially, as will be readily appreciated by those of ordinary skill in the art, the voltage applied to the gradient coil 22 by the conductor 28 is measured at the input of differential amplifier 24 connected to the conductor 32. However, to compensate for the relatively small voltage drop across the gradient coil 22, due to the extremely low impedance thereof, the voltage at the junction between the gradient coil 22 and ground is applied through the conductor 34 to the negative input of the differential amplifier 24. The output of the differential amplifier 24 on conductor 36 thus represents the voltage applied to the gradient coil 22 and is a measure of the voltage across the load itself. This value of voltage is applied through the conductor 36 to the integrator 26.

The integrator 26 may take any of the conventional forms of this well-known class of device. Here, the integrator 26 acts to integrate correctly over the relevant frequency band during the relevant time. Since voltage V equals $d\phi/dt$ it will be seen that the output of the integrator 26 on conductor 38 effectively represents the integral of the voltage or the flux $\phi$ being produced within the coil 22. This value is supplied through the conductor 38 to the differential input (−) of the power amplifier 20 so that in effect a value corresponding to the flux is fed back to the amplifier.

Since, no series feedback resistor is now present within the power amplifier 20, it will be seen that the power amplifier 20 is now operating in what maybe defined as a flux output mode where the field produced within the gradient coil 22 is proportional to the voltage signal applied by the power amplifier 20 to the conductor 28. Since a value corresponding to the flux is fed back on conductor 38 to the differential input of the amplifier 20, the flux produced by the gradient coil 22 is forced to conform to the voltage signal at the output of the power amplifier 20 which accurately reflects the voltage signal applied to the input thereto which is appropriately predistorted by the flux signal fed back. Thus, effectively this arrangement forces the flux back to the shape of the voltage input which provides automatic compensation for any eddy currents which may be present. Here, rather than to attempt to vary voltage or current on the flux being produced, the flux is forced to conform to the input voltage and the output voltage on conductor 28 is varied by the flux fed back until a conforming relationship is obtained.

Those of ordinary skill in the art will appreciate that integrating the difference voltage also creates a condition where the longer the error in flux exists, the greater is the attempt by the feedback circuit established to compensate for it. Thus, the flux is forced back to the shape of the voltage and when no difference is present in the proportional relationship established, no change in the output of the power amplifier 20 occurs. The compensation scheme also does not rely on adding current by way of predistortion to the output of the power amplifier 20. Thus, only the current that is required is used.

This of course, avoids excessive heating in the power amplifier due to the dissipation of maximum voltage levels on a continuous basis and additionally allows closer operation to the maximum power bandwidth of the amplifier regardless of whether pulse, sinusoidal, or various combination sequences are employed. Accordingly, optimization for whatever sequence is present is automatically present since only the voltage required is utilized while availability is maintained. Additionally, automatic compensation for eddy current effects on the flux produced within the gradient coil is achieved since the flux produced is automatically forced to conform to the input voltage regardless of the eddy current effects which are present. Accordingly, while it is still desirable to maintain design parameters which minimize the effects of eddy currents, costly empirical compensation techniques need not be employed since by feeding back a value corresponding to flux, the flux present in the coil is forced to conform to a desired input waveform.

In the instant embodiment of the present invention, the gradient coil is effectively employed as a sensing coil to achieve exact eddy current compensation by forcing the flux generated in the gradient coil 22 to emulate the input voltage to the power amplifier 20. Since the field produced in the gradient coil 22 is proportional to a voltage signal rather than a current, the power amplifier 20 exhibits relatively low output impedance. Full bandwidth is provided for both pulse mode and sinusoidal sequences enabling gradient switching to be fully utilized without any requirement for switching the impedance characteristics of the amplifier to accommodate particular sequences or to achieve eddy current compensation through predistortion techniques except that achieved by the flux signal fed back. Switching may thus occur at the maximum rate available to the power amplifier 20.

Those with ordinary skill in the art will recognize that the differential amplifier 24 and integrator 26, as well as the connections therefor may be packaged within the power amplifier 20 as a replacement for the series resistance normally provided therein. Accordingly, implementation of the instant invention from the standpoint of cost and packaging is little different from utilization of the series resistance configuration normally employed.

Although the instant invention has been described in connection with a highly specific exemplary embodiment thereof, it will be understood that many modifications and variations thereof will be readily apparent to those of ordinary skill in the art. Therefore, it is manifestly intended that this invention be only limited by the claims and the equivalents thereof.

What is claimed is:

1. Apparatus for controlling power amplifier means in driving a highly inductive load comprising:
   means for sensing voltage applied by said power amplifier means to said highly inductive load;
   means for integrating said voltage sensed to obtain a signal representing flux; and
   means for applying said signal representing flux to said power amplifier means to control said voltage applied by said power amplifier means to said highly inductive load.

2. The apparatus according to claim 1 wherein said means for sensing includes said highly inductive load.

3. The apparatus according to claim 1 wherein said means for sensing includes differential amplifier means connected across said highly inductive load.

4. The apparatus according to claim 1 wherein said highly inductive load takes the form of a low resistance gradient coil.

5. The apparatus according to claim 1 wherein said power amplifier means includes first and second differential inputs, an output, and is operated in a flux output mode.

6. The apparatus according to claim 5 additionally comprising means for connecting said output of said power amplifier means to said highly inductive load and said means for applying said signal representing flux being connected to one of said first and second differential inputs of said power amplifier means to establish a feedback loop to conform said signal representing flux to a voltage waveform applied to another of said first and second differential inputs to said power amplifier means.

7. The apparatus according to claim 6 wherein said means for sensing includes differential amplifier means connected across said highly inductive load.

8. The apparatus according to claim 7 wherein said highly inductive load takes the form of a low resistance gradient coil.

9. A method of controlling flux generated in a coil to conform the same to an input waveform independently of eddy current effects comprising the steps of:
   applying said input waveform to one input of a power amplifier having differential inputs;
   operating said power amplifier in a voltage output mode;
   connecting an output from said power amplifier to said coil;
   sensing voltage applied to said coil and developing a signal corresponding to said voltage sensed;
   integrating said signal corresponding to said voltage sensed to develop feedback information representing flux; and
   applying said feedback information to a differential input of said power amplifier to cause said feedback information representing flux to conform to said input waveform.

10. The method according to claim 9 wherein said step of sensing is accomplished by measuring the voltage across said coil.

11. Apparatus for controlling power amplifier means to conform flux generated in a coil driven by said power amplifier means to an input waveform applied to said power amplifier means, said apparatus comprising:

means for applying a selected input waveform to an input of said power amplifier means;

means for connecting an output of said power amplifier means to said coil;

means for sensing voltage across said coil and developing a signal corresponding to said voltage sensed;

means for integrating said signal to develop feedback information representing flux; and means for feed back said information representing flux to said power amplifier means to vary said output of said power amplifier means to cause said feedback information to conform to said input waveform.

12. The apparatus according to claim 11 wherein said means for sensing includes differential amplifier means connected across said coil.

13. The apparatus according to claim 11 wherein said coil takes the form of a low resistance gradient coil.

14. The apparatus according to claim 11 wherein said power amplifier means is operated in a voltage output mode.

* * * * *